(12) United States Patent
Davidson

(10) Patent No.: US 6,777,969 B1
(45) Date of Patent: Aug. 17, 2004

(54) LOW STRESS TEST MODE

(75) Inventor: Colin Davidson, Basingstoke (GB)

(73) Assignee: Cypress Semiconductor Corp., San Jose, CA (US)

( * ) Notice: Subject to any disclaimer, the term of this patent is extended or adjusted under 35 U.S.C. 154(b) by 59 days.

(21) Appl. No.: 09/813,605

(22) Filed: Mar. 21, 2001

(51) Int. Cl.[7] ............................................. G01R 31/28
(52) U.S. Cl. ...................................... 324/765; 324/763
(58) Field of Search ........................... 324/73.1, 158.1, 324/763, 765, 760

(56) References Cited

U.S. PATENT DOCUMENTS

| | | | | |
|---|---|---|---|---|
| 4,961,053 A | * | 10/1990 | Krug ........................... 257/148 |
| 5,070,297 A | * | 12/1991 | Kwon et al. ................. 324/754 |
| 5,241,266 A | * | 8/1993 | Ahmad et al. ............... 714/733 |
| 5,701,666 A | * | 12/1997 | DeHaven et al. ............. 29/583 |
| 5,929,651 A | * | 7/1999 | Leas et al. ................... 324/754 |
| 5,999,390 A | * | 12/1999 | Cho et al. ...................... 361/86 |

* cited by examiner

*Primary Examiner*—Ernest Karlsen
(74) *Attorney, Agent, or Firm*—Marger Johnson & McCollom, P.C.

(57) ABSTRACT

The present invention is directed to an apparatus and method for low stress test modes. A method of performing a low stress test mode may include applying an initial voltage in an amount sufficient to perform a device burn-in to a first device and a second device. Voltage at the second device is reduced, wherein voltage is reduced at the second device while voltage at the first device is at an amount sufficient to perform device burn-in.

29 Claims, 4 Drawing Sheets

LOW STRESS TEST MODE

FIELD OF THE INVENTION

The present invention generally relates to the field test modes, and particularly to method and apparatus for providing a low stress test mode.

BACKGROUND OF THE INVENTION

The testing of semiconductor devices is utilized to insure product reliability before shipment of the device. The process is generally termed a "burn-in" process, in which the device is stressed to test the operation of the device. Semiconductor device failure rates as a function of time indicate that devices that survive an initial testing period operate reliably during the contemplated life span of the device. Thus, to promote device integrity, early failures in marginal and defective devices may be forced before the devices are sent to assembly plants for packaging, final testing, and the like.

To lower the period of time needed to test the device, the burn-in process may include power and temperature extremes to test for semiconductor device failure. For example, super voltage test modes may utilize high voltages to save time and money by utilizing power extremes to encourage failures in devices to occur sooner. However, super-voltages may damage some devices more than other devices coupled to a circuit.

For instance, super voltage test mode entry for use in test modes during burn-in may require high voltages, such as greater than 2.5 volts above the power supply test voltage applied to the gates of an input buffer to enter and remain in test mode. The additional 2.5 volts above power supply are required to prevent spurious test mode entry due to power supply noise. For example, with power supply test voltages of 7 volts, greater than 9.5 volts is applied to the gates of an input buffer to enter and remain in test mode. The high voltage stress may cause voltage shifts on an input buffer device, which may result in problems during normal device operations. If other components are available on a circuit, there are no viable alternatives to testing the device and ensuring integrity of devices on the circuit. For example, devices may not be adequately tested due to the desire to prevent damage to susceptible devices, such as an input buffer, or a susceptible device may be stressed to the point of causing failure during normal operation.

Therefore, it would be desirable to provide a method and apparatus for providing low stress test modes.

SUMMARY OF THE INVENTION

Accordingly, the present invention is directed to an apparatus and method for low stress test modes. In a first aspect of the present invention, a method of performing a low stress test mode includes applying an initial voltage in an amount sufficient to perform a device burn-in to a first device and a second device. Voltage at the second device is reduced, wherein voltage is reduced at the second device while voltage at the first device is at an amount sufficient to perform device burn-in.

In a second aspect of the present invention, a low stress test circuit includes a voltage supply. The voltage supply is suitable for providing voltage in an amount sufficient to perform a test mode burn-in. A first device and a second device are coupled to the voltage supply. A voltage stress reducer is positioned between the second device and the voltage supply, the voltage stress reducer suitable for reducing voltage at the second device from an initial voltage level supplied by the voltage supply to the second device to a reduced voltage level, while voltage at the first device remains at an amount sufficient to perform device burn-in.

In a third aspect of the present invention, a low stress test circuit includes a means for supplying test voltage. The test voltage supply means is suitable for providing voltage in an amount sufficient to perform a test mode burn-in. A first device and a second device are coupled to the test voltage supply means. A means for reducing voltage stress is also included, the voltage stress reducing means positioned between the second device and the test voltage supply means, the voltage stress reducing means suitable for reducing voltage at the second device from an initial voltage level supplied by the test voltage supply means to the second device to a reduced voltage level while voltage at the first device remains at an amount sufficient to perform device burn-in.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Referring generally now to FIGS. 1 through 4, exemplary embodiments of the present invention are shown. The following embodiments describe a variety of methods and apparatus suitable for providing low stress test modes. Test mode entry, which may include a burn in process, may utilize power extremes, such as power levels above those typically encountered by the device in normal operation, and the like to lower a period of time required to stress a device to verify its operating capacity. However, the testing of devices in a system may be difficult to execute due to differing susceptibility of devices in the system to these extremes. Therefore, testing may be targeted to different devices of a system based on device susceptibility to the extremes, such as voltage, temperature and the like.

Figure 1:
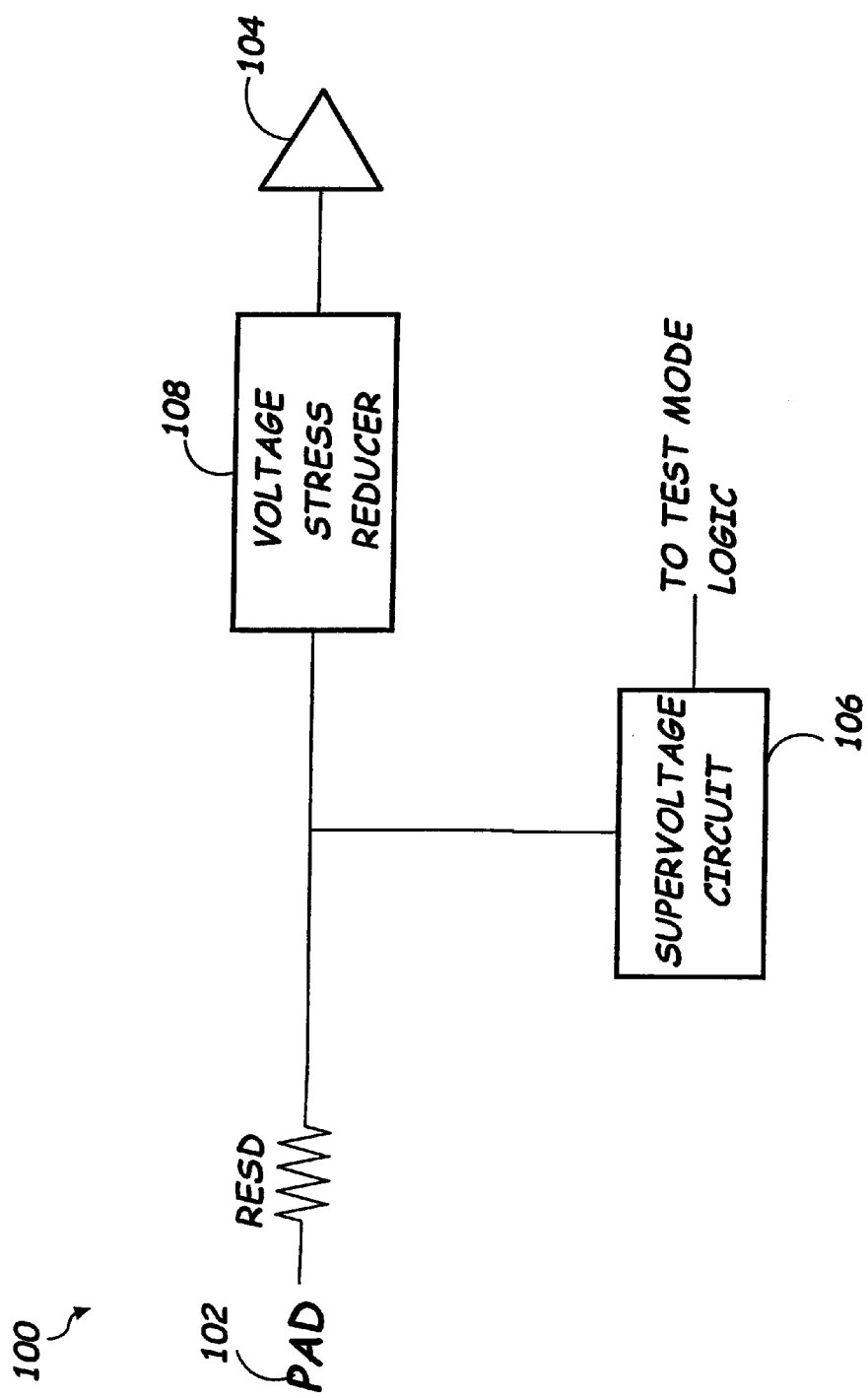
FIG. 1 is a diagram of an exemplary embodiment of the present invention wherein a circuit suitable for providing a low stress test mode is shown.

Referring now to FIG. 1, an exemplary embodiment 100 of the present invention is shown wherein a circuit is suitable for providing a low stress test mode. Super voltage test modes, in which higher voltages are applied to a device than those encountered in normal operation, used in test modes during burn-in may require high voltages, such as voltage of 9.5 volts and beyond. However, there may exist in a system certain devices that are more susceptible to the stress caused during burn in than other devices in the system. Therefore, it may be desirable to apply different stresses to devices during a testing procedure. For example, an input buffer during test mode burn in may receive high voltages applied to gates of the input buffer. The high voltage stress may then cause voltage shifts on the input buffer, which may result in problems during normal operation of the input buffer. By reducing the voltage applied to the input buffer, such as the amount of time the voltage is applied, varying the amount of voltage applied to the input buffer and the like, the input buffer may be protected from damage.

For example, it may be desirable to test a device at 7 volts power supply test voltage. To enter and maintain test mode a voltage of 9.5 volts is required at a device PAD 102. However, the high voltage when applied to the gates of an input buffer 104, attached to the super-voltage circuit 106, may cause voltage shifts on the input buffer 104 in normal operation. Therefore, a voltage stress reducer 108 is included to reduce voltage stress at the gates of the input buffer 104 during a super-voltage test mode. The voltage stress reducer 108 may reduce stress utilizing a variety of methods, including applying a first test voltage, and then reducing the test voltage to a voltage corresponding to an approximate normal operating voltage for the device, and the like as contemplated by a person of ordinary skill in the art.

Figure 2:
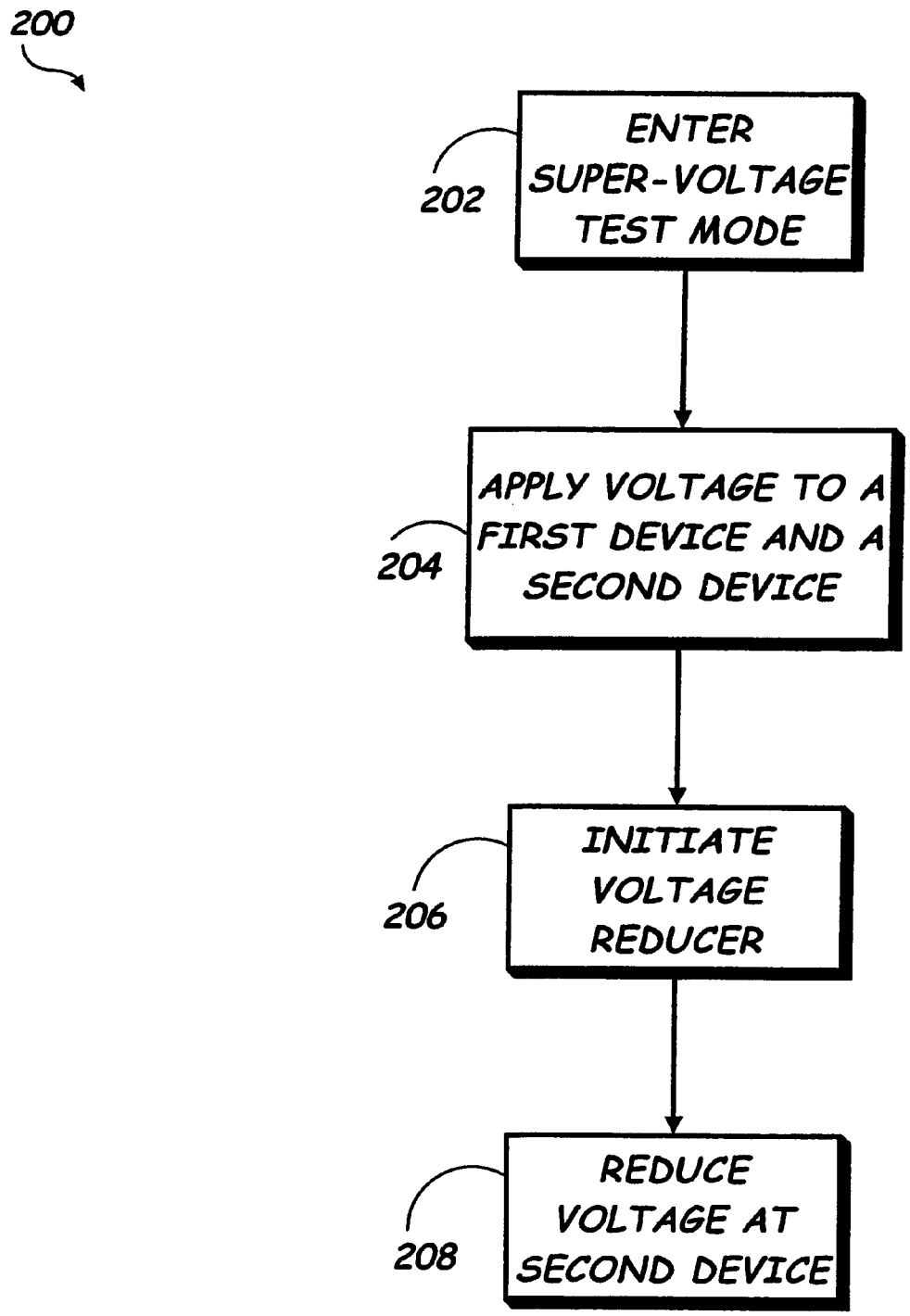
FIG. 2 is a flow diagram of an exemplary method of the present invention wherein a low stress test mode is shown.

Referring now to FIG. 2, an exemplary method 200 of the present invention is shown wherein entry into a low stress test mode for an input buffer is shown. A super-voltage test mode is entered 202. A voltage is applied to a first device and a second device 204, the voltage suitable for performing a device burn in. A voltage stress reducer is initiated 206, thereby reducing voltage at the second device 208. In this way, burn in may be performed on two devices at once, with a device susceptible to the voltage more so than the first device being protected.

For instance, it may be preferable to apply a high voltage to both a first device and a second device, but apply the voltage at a second lower amount than the first device to protect the device from damage. Therefore, a first high voltage may be applied to both the first device and a second device, but then have the voltage reduced to the second device, such as to a lower voltage testing amount, an amount generally equal to an amount of voltage the device may encounter in normal operation, and the like as contemplated by a person of ordinary skill in the art. Thus, both devices in a circuit may be tested, with a device more susceptible to a high voltage protected, yet still enabling a device not sensitive to the higher voltage to be tested normally.

Figure 3:
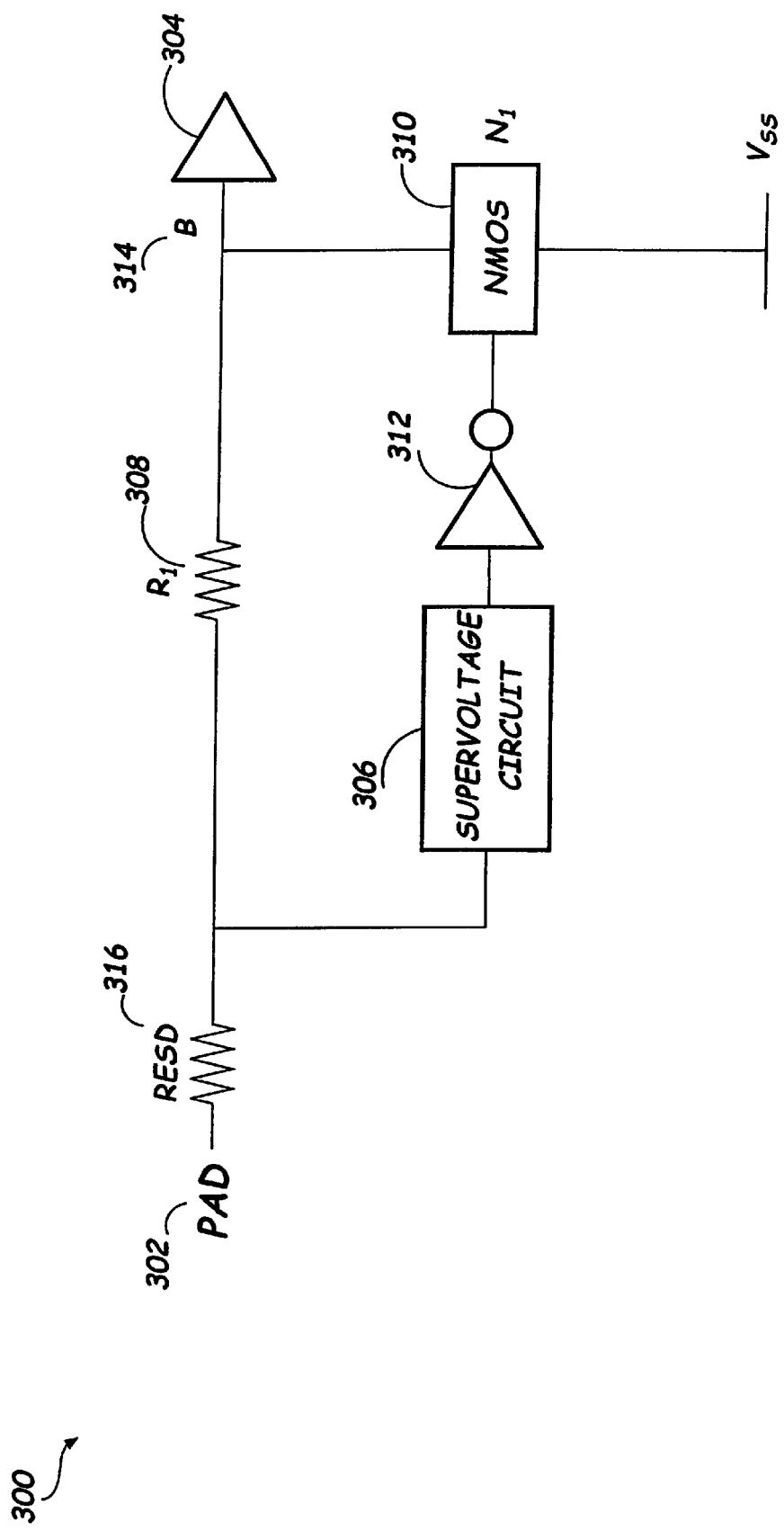
FIG. 3 is a diagram of an exemplary embodiment of the present invention wherein a circuit suitable for providing a low stress test mode includes a voltage stress reducer configured as a voltage divider.

Referring now to FIG. 3, an exemplary embodiment 300 of the present invention is shown wherein a circuit suitable for low stress test mode entry includes a voltage stress reducer configured as a voltage divider. In this example, a super-voltage circuit 306 tests a PAD 302 and an input buffer 304. Sufficient additional input resistance is added at $R_1$ 308 and transistor $N_1$ 310 to form a voltage divider when entering super-voltage test mode to reduce voltage stress at a gate of the input buffer 304. An inverter 312 is included to initiate the transistor 310 during a test mode.

Thus, a low stress test mode may be provided for protection of a voltage sensitive device. For example, the voltage stress reducer 108 (FIG. 1) may be configured as a controlled voltage resistor divider. When high voltage is detected at the PAD 302, the super-voltage circuit output goes low and the inverter 312 output goes high. This activates a high voltage NMOS transistor 310, pulling the voltage at node B 314 down. It may be preferable to configure the circuit so that $N_1$ 310 may be sized such that the "on resistance", $R_2$ of $N_1$ 310 is less than or equal to the resistance between the PAD 302 and the input buffer 304.

For example, in operation, assuming 7V external (vcch) +3.4V internal (regulator output) voltage, and if the 9.5 volts at the pad were required to stay in test mode, the circuit may function as the following. In this instance, the voltage stress reducer 108 (FIG. 1) is configured as a controlled resistor divider. When high voltage is detected at the PAD 302, the super-voltage circuit output goes low (0V) and the inverter 312 output goes high (3.4V). This activates a high voltage NMOS transistor 310, pulling the voltage at node B 314 down.

The circuit is configured so that total resistance between the pad 302 and the node B 314 is less than or equal to 1000 ohms. Utilizing this assumption, let RESD 316 plus $R_1$ 308 be equal to 1000 ohms. Also assuming that $N_1$ 310 may be sized such that the "on resistance", $R_2$ of $N_1$ 310 is less than or equal to RESD 316 and $R_1$ 308, i.e. 1000 ohm maximum, and also assuming the ground gate NMOS 310 does not snap back when 9.5 volts are applied at the pad 302.

If 9.5 volts were instantaneously applied at the pad 302 and held at 9.5 volts, the output of circuit 306 may go low after approximately 22ns. After another approximate 200ps delay, output of the inverter 312 controlling gate of $N_1$ 310 would go to 3.4 volts. If $R_2$ is less than or equal to $R_1$ 308 plus RESD 316, then voltage at node B 314 will drop to a maximum of 9.5/2=4.75 volts, which is within normal voltage range for transistor gate voltage. In this way, the circuit of FIG. 3 would thus solve the problem of having high voltage on transistor gates at the input buffer 304.

Figure 4:
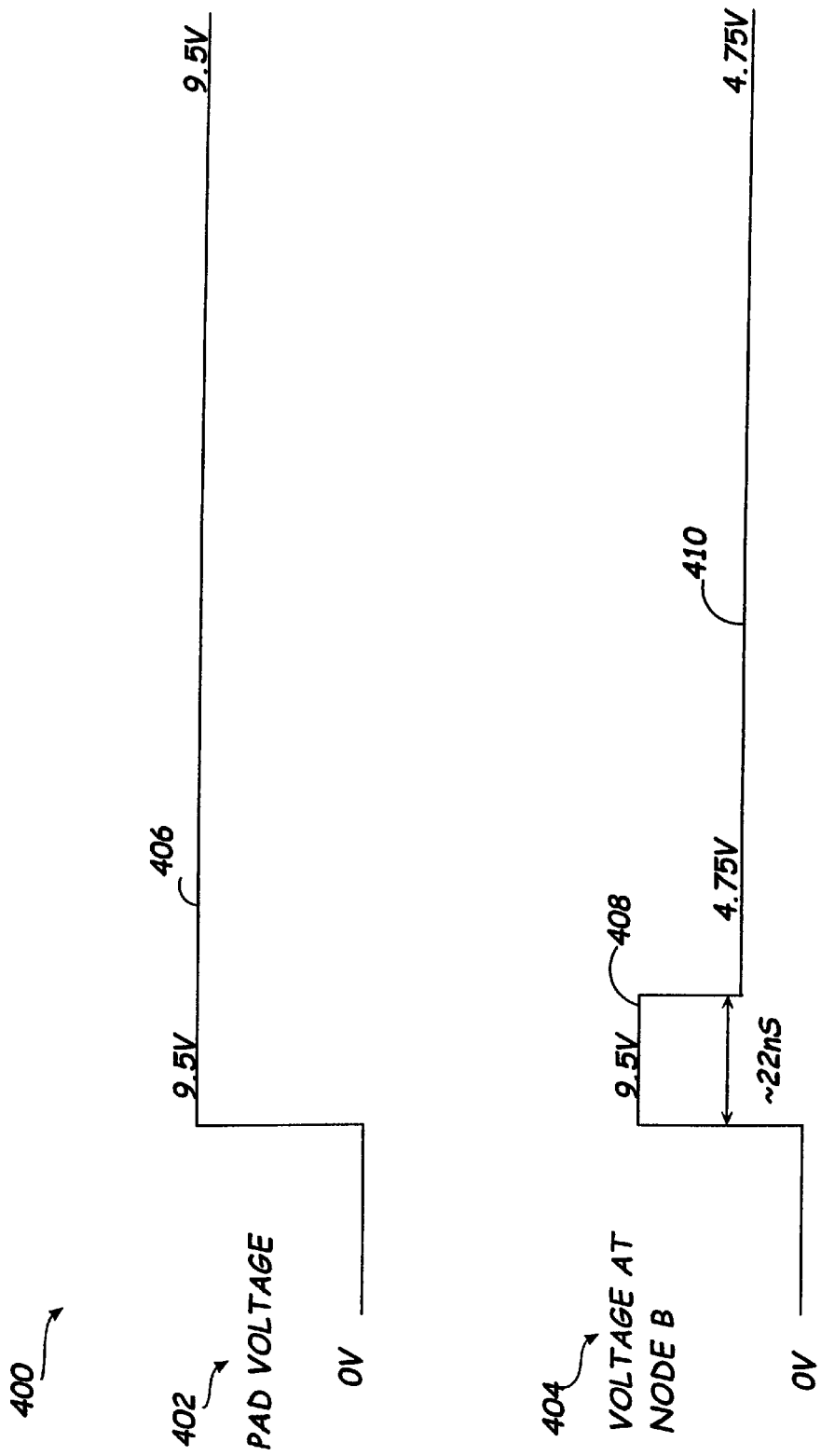
FIG. 4 is an illustration of an exemplary embodiment of the present invention wherein waveforms of devices being tested by a low stress test circuit of the present invention is shown.

Thus, the waveforms seen at the PAD 302, and at node B 314, may be exemplified in the embodiment 400 depicted in FIG. 4. Voltage is shown at PAD 402 and Node B 404. The PAD voltage 402 and the Node B voltage 404 may reach a level sufficient for testing, such as 9.5 volts 406 & 408. However, Node B may be susceptible to increased voltages over a period of time. Therefore, the voltage stress reducer is initiated, such as by activating a transistor 310 (FIG. 3), so that the voltage at Node B drops to 4.75 volts 410. Thus, PAD voltage 402 remains at a higher level, while the voltage at Node B 404 is lowered to normal operating levels. Although lowering to normal operating levels is disclosed, it should be apparent that the voltage at Node B may be lowered to a lower testing level above the range of normal operating levels to provide continued lowered stress testing, stopped altogether, and the like as contemplated by a person of ordinary skill in the art.

Although low stress test mode entry and utilization is described, it should be apparent that a variety of applications, system environments, and the like are contemplated by the present invention. In exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the apparatus and method for low stress test mode entry of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A method of performing a low stress test mode, comprising:
   applying an initial voltage in an amount sufficient to perform a device burn-in to a first device and a second device; and
   reducing the initial voltage at the second device to a non-zero level, while the voltage at the first device remains at an amount sufficient to perform device burn-in.

2. The method as described in claim 1, wherein the voltage at the second device is reduced to a level including at least one of approximate operating voltage level and a second voltage testing level lower than the initial voltage.

3. The method as described in claim 1, wherein reducing includes at least one of reducing an amount of time the voltage is applied and varying an amount of voltage applied to the second device.

4. The method as described in claim 1, wherein reducing the voltage includes initiating a voltage stress reducer.

5. The method as described in claim 4, wherein the voltage stress reducer includes a voltage divider.

6. The method as described in claim 5, wherein the voltage divider includes addition of sufficient input resistance between the first device and the second device and a transistor between the second device and a voltage application circuit.

7. The method as described in claim 6, wherein the voltage divider further includes an inverter between the voltage application circuit and the transistor, the inverter suitable for activating the transistor.

8. The method as described in claim 1, wherein the second device is more susceptible to voltage levels above those typically encountered during normal operation of the second device than the first device.

9. The method as described in claim 1, wherein the second device includes an input buffer.

10. A low stress test circuit, comprising:
    a voltage supply, the voltage supply suitable for providing voltage in an amount sufficient to perform a test mode burn-in;
    a first device coupled to the voltage supply;
    a second device coupled to the voltage supply; and
    a voltage stress reducer positioned between the second device and the voltage supply, the voltage stress reducer suitable for reducing voltage at the second device from an initial voltage level supplied by the voltage supply to a reduced, non-zero voltage level while voltage at the first device remains at an amount sufficient to perform device burn-in.

11. The low stress test circuit as described in claim 10, wherein the voltage stress reducer includes a voltage divider.

12. The low stress test circuit as described in claim 11, wherein the voltage divider includes addition of sufficient input resistance between the first device and the second device and a transistor between the second device and a voltage application circuit.

13. The low stress test circuit as described in claim 12, wherein the voltage divider further includes an inverter between the voltage application circuit and the transistor, the inverter suitable for activating the transistor.

14. The low stress test circuit as described in claim 10, wherein the voltage at the second device is reduced to a level including at least one of approximate operating voltage level and a second voltage testing level lower than the initial voltage.

15. The low stress test circuit as described in claim 10, wherein the voltage is reduced including at least one of reducing an amount of time the voltage is applied and varying an amount of voltage applied to the second device.

16. The low stress test circuit as described in claim 10, wherein the second device includes an input buffer.

17. The low stress test circuit as described in claim 10, wherein the second device is more susceptible to voltage levels above those typically encountered during normal operation of the second device than the first device.

18. A low stress test circuit, comprising:
    a means for supplying test voltage, the test voltage supply means suitable for providing voltage in an amount sufficient to perform a test mode burn-in;
    a first device coupled to the test voltage supply means;
    a second device coupled to the test voltage supply means; and
    a means for reducing voltage stress, the voltage stress reducing means positioned between the second device and the test voltage supply means, the voltage stress reducing means suitable for reducing voltage at the second device from an initial voltage level supplied by the test voltage supply means to the second device to a reduced, non-zero voltage level while voltage at the first device remains at an amount sufficient to perform device burn-in.

19. The low stress test circuit as described in claim 18, wherein the voltage stress reducing means includes a voltage divider.

20. The low stress test circuit as described in claim 19, wherein the voltage divider includes addition of sufficient input resistance between the first device and the second device and a transistor between the second device and a voltage application circuit.

21. The low stress test circuit as described in claim 20, wherein the voltage divider further includes an inverter between the voltage application circuit and the transistor, the inverter suitable for activating the transistor.

22. The low stress test circuit as described in claim 20, wherein the transistor includes an N-mos transistor.

23. The low stress test circuit as described in claim 18, wherein the voltage at the second device is reduced to a level including at least one of approximate operating voltage level and a second voltage testing level lower than the initial voltage.

24. The low stress test circuit as described in claim 18, wherein the second device includes an input buffer.

25. The low stress test circuit as described in claim 18, wherein reducing the voltage includes at least one of reducing an amount of time the voltage is applied and varying an amount of voltage applied to the second device.

26. The low stress test circuit as described in claim 10, wherein the voltage stress reducer reduces voltage at the second device from an initial voltage level supplied by the voltage supply sufficient to provide a device burn-in to the second device to a reduced voltage level while voltage at the first device remains at an amount sufficient to perform device burn-in.

27. The low stress test circuit as described in claim 18, wherein the voltage stress reducing means reduces voltage at the second device from an initial voltage level supplied by the voltage supply sufficient to provide a device burn-in to the second device to a reduced voltage level while voltage at the first device remains at an amount sufficient to perform device burn-in.

28. A low stress test circuit, comprising:

a voltage supply, the voltage supply suitable for providing voltage in an amount sufficient to perform a test mode burn-in;

a first device coupled to the voltage supply;

a second device coupled to the voltage supply; and a voltage stress reducer including a voltage divider having sufficient input resistance between the first device and the second device and a transistor between the second device and a voltage application circuit, the voltage stress reducer suitable for reducing voltage at the second device from an initial voltage level supplied by the voltage supply to the second device to a reduced voltage level while voltage at the first device remains at an amount sufficient to perform device burn-in.

29. The low stress test circuit as described in claim 28, wherein an inverter is included to initiate the transistor, the transistor being an NMOS transistor, so that when the voltage application circuit goes low in response to detection of a high voltage, the inverter output goes high, which activates the NMOS transistor, pulling voltage at the second device down to the reduced voltage level.

* * * * *